(12) United States Patent
Ina

(10) Patent No.: US 7,106,419 B2
(45) Date of Patent: Sep. 12, 2006

(54) EXPOSURE METHOD AND APPARATUS

(75) Inventor: Hideki Ina, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/012,617

(22) Filed: Dec. 15, 2004

(65) Prior Publication Data

US 2005/0128454 A1    Jun. 16, 2005

(30) Foreign Application Priority Data

Dec. 15, 2003    (JP)    ............................ 2003-415891

(51) Int. Cl.
*G03B 27/52* (2006.01)
*G03B 27/42* (2006.01)
(52) U.S. Cl. .......................................... 355/55; 355/53
(58) Field of Classification Search ................ 355/52, 355/53, 55, 67, 77; 250/548; 356/399–401
See application file for complete search history.

(56) References Cited

U.S. PATENT DOCUMENTS

| | | | |
|---|---|---|---|
| 4,849,901 A * | 7/1989 | Shimizu ..................... 700/121 |
| 5,365,051 A * | 11/1994 | Suzuki et al. ............. 250/201.2 |
| 5,448,332 A | 9/1995 | Sakakibara et al. ........... 355/53 |
| 5,525,808 A * | 6/1996 | Irie et al. ..................... 250/548 |
| 5,750,294 A | 5/1998 | Hasegawa et al. ............. 430/22 |
| 5,998,801 A * | 12/1999 | Imai ............................. 250/548 |
| 6,426,508 B1 * | 7/2002 | Kosugi et al. ............... 250/548 |
| 6,538,721 B1 * | 3/2003 | Okita et al. .................... 355/53 |
| 6,975,384 B1 * | 12/2005 | Ina ............................... 355/55 |

FOREIGN PATENT DOCUMENTS

| | | |
|---|---|---|
| JP | 6-283403 | 10/1994 |
| JP | 06-260391 | 11/1994 |
| JP | 9-045609 | 2/1997 |

* cited by examiner

*Primary Examiner*—Henry Hung Nguyen
(74) *Attorney, Agent, or Firm*—Morgan & Finnegan, L.L.P.

(57) ABSTRACT

An exposure method for exposing a pattern on a reticle onto plural shots on an object, includes the steps of measuring flatness information of each of the plural shots on the object, identifying a shot as a specific shot among the plural shots, the specific shot having flatness that is measured in the measuring step and outside a predetermined range, obtaining positional information by measuring plural measurement points on the object, the obtaining step obtaining more detailed positional information of the specific shot identified by the identifying step than that of a non-specific shot that is not the specific shot, and controlling at least one of a position and a tilt of the object using the positional information obtained by the obtaining step.

9 Claims, 10 Drawing Sheets

EXPOSURE METHOD AND APPARATUS

BACKGROUND OF THE INVENTION

The present invention relates generally to an exposure method and apparatus, and more particularly to an exposure method and apparatus used to expose various objects such as a single crystal substrate for a semiconductor wafer, a glass plate for a liquid crystal display ("LCD"), and the like. The present invention is suitable, for example, an exposure method and apparatus that utilizes a step and scan manner for exposure.

Conventionally used projection exposure apparatuses use a projection optical system to project a circuit pattern on a mask (or a reticle) onto a wafer, etc. in manufacturing such devices as a semiconductor device, a LCD device and a thin-film magnetic head in the photolithography technology.

The trend of the fine and high-density integrated circuits requires the projection exposure apparatus to expose a circuit pattern on the reticle onto a wafer with high resolving power. The minimum critical dimension transferable by the projection exposure apparatus (resolution) is proportionate to a wavelength of exposure light, and inversely proportionate to the numerical aperture ("NA") of the projection optical system. The shorter the wavelength is, the better the resolution is. Accordingly, the light source in recent years has been in transition from an ultra-high pressure mercury lamp (g-line with a wavelength of approximately 436 nm) and i-line with a wavelength of approximately 365 nm) to KrF excimer laser (with a wavelength of approximately 248 nm) and ArF excimer laser (with a wavelength of approximately 193 nm). Practical use of $F_2$ excimer laser (with a wavelength of 157 nm) has been promoted. A wider exposure area is also required.

A step-and-repeat exposure apparatus (also referred to as a "stepper") for entirely projecting and exposing an approximately square exposure area onto a wafer with a reduced exposure area is being replaced mainly with a step-and-scan exposure apparatus (also referred to as a "scanner") for accurately exposing a wide screen of exposure area through a rectangular slit with relatively and quickly scanning the reticle and the wafer.

In exposure, the scanner uses a surface-position detector having an oblique light irradiating system to measure a surface height at a certain position on the wafer before the exposure slit area moves to the certain position on the wafer, and accords the wafer surface with an optimal exposure image-surface position when exposing the certain position, thereby minimizing the influence of the flatness of the wafer.

In particular, there are plural measurement points in longitudinal direction of the exposure slit, i.e., a direction orthogonal to the scan direction, at front and back portions of the exposure slit area to measure an inclination or tilt of the surface as well as a height or focus of the wafer surface position. In general, the scanning exposure proceeds in both directions from the front portion and from the back portion (see, for example, Japanese Patent Application Publication No. 9-45609 corresponding to U.S. Pat. No. 5,750,294).

Japanese Patent Application, Publication No. 6-260391 (corresponding to U.S. Pat. No. 5,448,332) proposes a method for measuring and correcting a surface position on a wafer in a scanner. This method arranges plural measurement points on a pre-scan area other than the exposure area to measure the focus and tilt in scan and non-scan directions. Japanese Patent Application, Publication No. 6-283403 (corresponding to U.S. Pat. No. 5,448,332) proposes another method for measuring, driving and correcting the focus and tilt in the scan and non-scan directions by arranging plural measurement points in the exposure area.

A description will be given of these proposals with reference to FIGS. 12 and 13. Here, FIG. 12 is a schematic sectional view of focus and tilt measurement points FP1 to FP3 on the wafer 1000. FIG. 13 is a schematic sectional view showing the wafer 1000 that has been driven to an optimal exposure image-surface position based on the measurement results. Referring to FIG. 12, the focus and tilt are sequentially measured at the measurement points FP1 to FP3 on the wafer 1000. A pre-scan plane PMP is calculated based on the measurement results from the measurement points FP1 to FP3, and the orientation of the wafer is driven and adjusted to the best focus plane BFP in moving the wafer 1000 to the exposure are an exposure slit 2000, as shown in FIG. 13.

However, the recent increasingly shortened wavelength of the exposure light and the high NA of the projection optical system require an extremely small depth of focus ("DOF") and a strict accuracy with which the wafer surface to be exposed is aligned to the best focus position BFP or so-called focus accuracy.

In particular, they require strict measurement and precise correction of the tilt of the wafer surface in the scan direction or width direction of the exposure slit. A wafer having the bad flatness has disadvantageous focus detection accuracy of the exposure area. For example, when the exposure apparatus has a DOF with 0.4 μm, the flatness of the wafer requires several nanometer order, for example, the flatness of the wafer needs 0.08 μm where it is one-fifth as long as the DOF, or 0.04 μm where it is one-tenth as long as the DOF. While a surface-position detector of the oblique light irradiating system measures the wafer's surface position before the area reaches the exposure slit, the measurement timing is discrete and no information is available or considered about the wafer's flatness between two timings. As a result, there is no information available between timings of the flatness of the wafer.

For example, suppose that this measurement timing is an interval of 3 mm on the wafer 1000 in the scan direction as shown in FIG. 14. Then, when the wafer 1000 has the bad flatness between an interval of 3 mm, for example, between points P1 to P3 in FIG. 14, the surface position offsets by Δ from the pre-scan plane PMP calculated by the measurement at the interval of 3 mm. Here, FIG. 14 is a schematic sectional view showing an offset of flatness between the pre-scan plane PMP and the wafer 1000.

In exposure, the pre-scan plane PMP is adjusted to the best focus plane BFP, and the exposure in FIG. 14 needs a shift by the amount of Δ. This defocus occurs in a direction orthogonal to the scan direction as well as the scan direction. This is due to an arrangement of measurement points of the above oblique light irradiating system, rather than the measurement timing.

The finer measurement timing in the scan direction and the increased number of measurement points in the oblique light irradiating system would reduce an offset error, but might disadvantageously lower the throughput due to the deteriorated scan speed in exposure time, increase measurement time and cost together with the complicated apparatus structure, and grows likelihood of troubles.

BRIEF SUMMARY OF THE INVENTION

Accordingly, it is an exemplified object of the present invention to provide an exposure method and apparatus for successfully correcting the focusing to the wafer surface's flatness without lowering the throughput.

An exposure method according to one aspect of the present invention for exposing a pattern on a reticle onto plural shots on an object, includes the steps of measuring flatness information of each of the plural shots on the object, identifying a shot as a specific shot among the plural shots, the specific shot having flatness that is measured in the measuring step and outside a predetermined range, obtaining positional information by measuring plural measurement points on the object, the obtaining step obtaining more detailed positional information of the specific shot identified by the identifying step than that of a non-specific shot that is not the specific shot, and controlling at least one of a position and a tilt of the object using the positional information obtained by the obtaining step.

An exposure apparatus according to another aspect of the present invention includes an exposure mode that executes the exposure method. An exposure apparatus according to still another aspect of the present invention for exposing a pattern on a reticle onto plural shots on an object, includes a first detector for detecting flatness of each of the plural shots on the object, and a second detector for detecting positional information of each of the plural shots according to the flatness detected by the first detector, wherein at least one of a position and a tilt of each of the plural shots is controlled based on the positional information detected by the second detector.

A device manufacturing method according to still another aspect of the present invention includes the steps of exposing an object using the above exposure apparatus, and developing the exposed object.

Other objects and further features of the present invention will become readily apparent from the following description of the preferred embodiments with reference to the accompanying drawings.

DETAILED DESCRIPTION OF THE PREFERRED EMBODIMENTS

Figure 1:
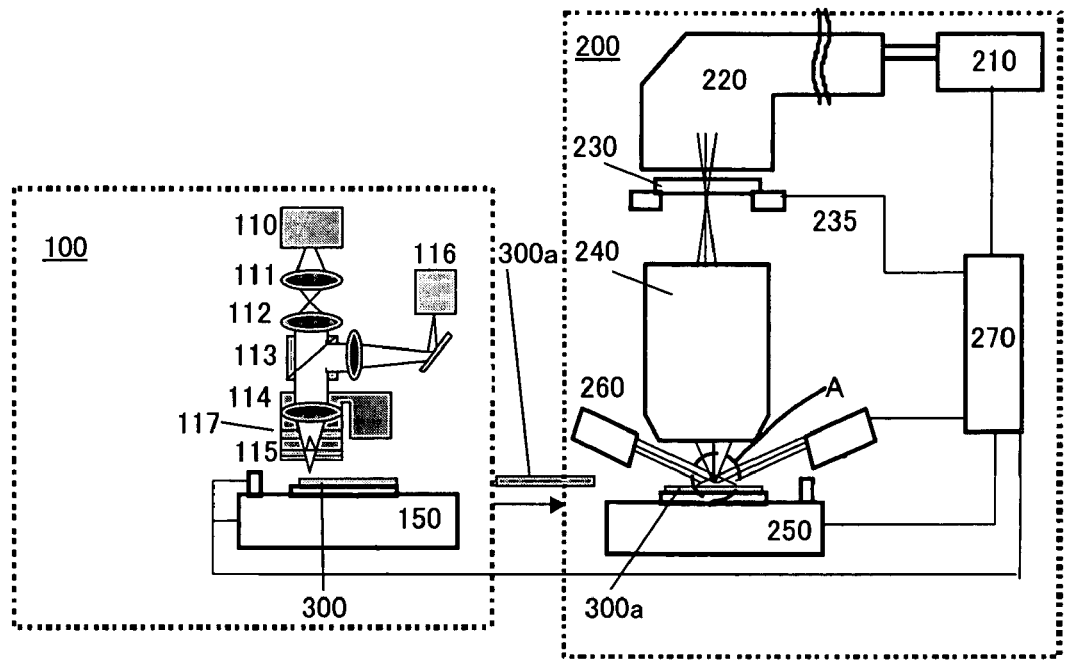
FIG. 1 is a block diagram of a schematic structure of an exposure apparatus of one embodiment according to the present invention.

A description will now be given of an exposure apparatus and method of one embodiment according to the present invention with reference to the accompanying drawings. In each figure, the same element is designated by the same reference numeral, and a duplicate description thereof will be omitted. Here, FIG. 1 is a block diagram of a schematic structure of an exposure apparatus 1 according to one aspect of the present invention.

The exposure apparatus 1 includes, as shown in FIG. 1, a measuring station 100, and an exposure station 200, and serves as a projection exposure apparatus that exposes onto a wafer a circuit pattern on a reticle, for example, in a step-and-scan manner. Such an exposure apparatus is suitable for a sub-micron or quarter-micron lithography process.

A description will now be given of a measuring station 200 that measures the flatness of the plural shots on the wafer 300 prior to the semiconductor manufacture process. The measuring station 200 measures the flatness of each shot on the wafer 300 based on the Mirau interferometry.

The light emitted from a halogen lamp 110, for example, as a light source of the interferometer transmits the illumination optical systems 111 and 112 and beam splitter 113, and then objective lens 114 and half mirror 115, expanded to a shot size on the wafer 300 to be detected or greater, such as 35 mm, and illuminates a shot to be measured, on the wafer 300. This wafer 300 is supported by the wafer stage 150.

The light reflected on the wafer 300 transmits the half mirror 115 and the objective lens 114, is reflected by the beam splitter 113, and enters a CCD camera 116 for photoelectric conversion.

On the other hand, the light reflected by the half mirror 115 enters an internal reference mirror 117 and is reflected on it. The light reflected on the internal reference mirror 117 is used as the reference light to be interfered with the reflected light from a target to be detected. The light reflected from the internal reference mirror 117 interferes with the reflected light from the wafer 300 as the target on the CCD camera 116. The light incident upon the CCD camera 116 is photoelectrically converted into a vide signal, and the flatness information of the shot on the wafer 300 can be obtained.

Figure 2:
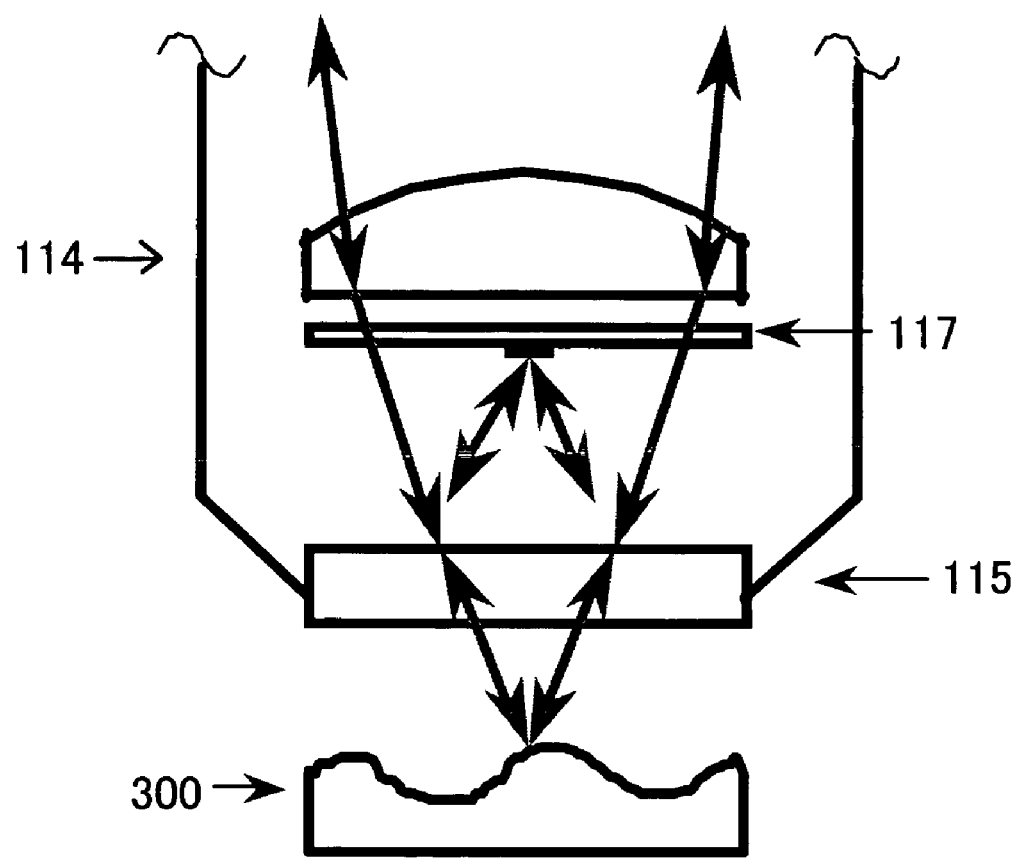
FIG. 2 is an enlarged view near an objective lens in a measuring station shown in FIG. 1.

As shown in FIG. 2, the Mirau interferometry characteristically arranges the internal reference mirror 117 between the objective lens 114 and the half mirror 115. This structure equalizes the optical path length between the reference light and the reflected light from the wafer 300 as the target, and enables one objective lens to form the white light interference with a small coherence length. Here, FIG. 2 is an enlarged view near the objective lens 114 of the measuring station 100.

A description will now be given of an interval at which the flatness information is available in the wafer 300. Suppose that the CCD camera 116 uses a ⅔-inch photoelectric conversion surface, an interval between the light-receiving cells is set to 13 µm, and the shot size on the wafer 300 to be detected is 35 mm square. Since the ⅔-inch photoelectric conversion surface is 6.6×8.8 mm², the light of about 6 mm square can be received. Where the optical magnification of the CCD camera 116 from the wafer 300 is 1/7.69, the 35 mm square on the wafer 300 corresponds to 4.55 mm square on the CCD camera 116. Therefore, the separable interval on the wafer 300 is 13×7.69=100 µm since an interval between the light-receiving cells the CCD camera 116 is 13 µm.

If one pixel on the CCD camera 116 can obtain one piece of flatness information, the flatness for each shot on the wafer 300 can be measured every 0.1 mm and the flatness information with an interval of 3 mm as a focus measuring interval in the scan can be obtained.

The measuring station 100 uses the Mirau interferometry to measure the more detailed flatness of each shot on the wafer 300 before the photoresist is applied onto the wafer 300 and the wafer 300 is exposed, than that obtained by the detecting system 260 for detecting the focus and tilt in the exposure station 200. The flatnesses of all the shots on the wafer 300 are measured, and a shot that has the bad flatness is identified as a specific shot, as described later.

Since the measurement that utilizes the perpendicularly incident light, like the Mirau interferometry, cannot correctly measure a pattern's step structure in the semiconductor process, the detecting system 260 in the exposure station 200 utilizes the oblique incident system that has an incident angle that is as large as possible. For example, the measurement that utilizes the perpendicularly incident light when the silicon wafer has a convex resist pattern, it is detected as a concave shape. Therefore, it is preferable that the focus detecting system in the exposure apparatus detects only the photoresist surface using the oblique incidence.

While the instant embodiment uses the Mirau interferometry and causes a similar problem, it is unnecessary to correctly obtain the pattern's step structure in measuring a difference between the shots and the detecting system that sensitively changes a detection signal in response to the step structure changes is suitable for the present invention. The perpendicular incidence has a necessary footprint that is smaller in structure than that of the oblique incidence, making the apparatus small and reducing the cost.

In the measuring station 100, the wafer 300a whose flatness information of each shot has been measured before the exposure is moved, as shown in FIG. 1, to the exposure station 200, and the exposure follows based on the flatness information of each shot on the wafer 300a. It is a preferable structure in which each moving wafer 300a improves the throughput without stopping the entire flow. When the lowered throughput is permissible, a wafer carrier (not shown) can transport, for example, twenty-five wafers to the exposure station 200 at a time.

A method for measuring the flatness f each shot on the wafer 300 in the measuring station 100 is not limited to the Mirau interferometry, but may utilize other interferometries, such as Michelson interferometry and linic interferometry. If the lowered throughput is permissible, the wafer 300 is moved through the wafer stage 150 and the measurement may be conducted several times to measure the flatnesses of all the shots.

The light incident system is not limited to the perpendicularly incident system, but may be confocal or the oblique incident system as in the detecting system 260 in the exposure station 200, which will be described later. The flatness may be measured without using the light as long as the predetermined resolution of the target to be detected is satisfied, and the atomic force microscope ("AFM"), for example, may measure the flatness.

Next, a description will be given of the exposure station 200. The light emitted from a light source 210, such as an excimer laser, illuminates a pattern formed on a reticle 230 through an illumination optical system 220 that converts the light into exposure light with an optimal shape. The pattern on the reticle 230 includes a circuit pattern to be exposed, and the light emitted through the pattern forms an image near the wafer 300a surface as an image surface through a projection optical system 240.

The reticle 230 is mounted on a reticle stage 235 movable in a plane orthogonal to an optical axis of the projection optical system 240 and in the optical-axis direction.

The wafer 300a is brought in from the measuring station 100, and mounted on a wafer stage 250 movable in a plane orthogonal to an optical axis of the projection optical system 240 and in the optical-axis direction.

A shot area on the reticle 230 is exposed by relatively scanning the reticle stage 235 and the wafer stage 250 at a speed corresponding to an exposure magnification ratio. After one shot exposure ends, the wafer stage 250 is stepped to a next shot for another scanning exposure to the next shot in a reverse direction. This process repeats until all the shots on the wafer 300 are exposed.

During the scan exposure of one shot, the exposure station obtains through the detecting system 260 surface position information on the surface of the wafer 300 to measure the focus and tilt, calculates the offset amount from the exposure image surface, and drives the stage 250 in focus (or height) and tilt (or inclination) directions, aligning the wafer 300 surface in the height direction for almost each exposure slit. As discussed later, the more detailed positional information of a surface for each specific shot is obtained than that of each non-specific shot, so as to position the shot having a bad flatness with precision in the height direction.

The detecting system 260 uses an optical height measurement system using a method for introducing light to the wafer 300 surface at a large angle (or low incident angle) and detecting an image offset of the reflected light from the wafer 300 using a position detector, such as a CCD camera. It irradiates light onto plural measurement points on the wafer 300, introduces each light to an individual sensor, and calculates the tilt of a surface to be exposed based on the height measurement information of different positions.

Figure 4:
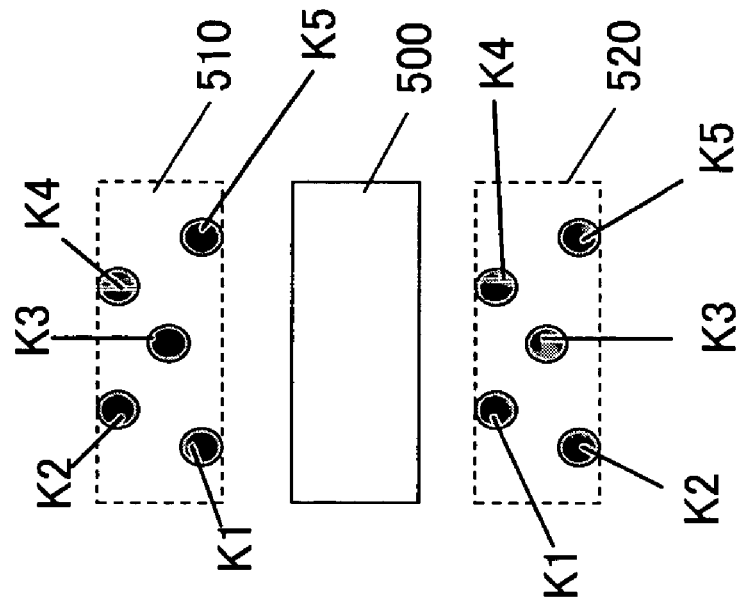
FIG. 4 is a plane view of an exposure area that arranges five measurement points.
Figure 3:
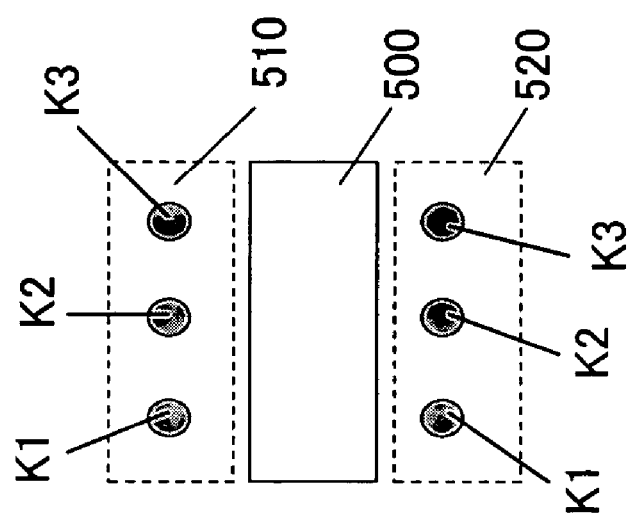
FIG. 3 is a plane view of an exposure area that arranges three measurement points.

Plural measurement points K1 to K5 are arranged, as shown in FIGS. 3 and 4, to form a surface shape in the front and back areas 510 and 520 in the exposure area 500 (or exposure slit) 500, so as to simultaneously measure focus and tilt information of the wafer 300, in particular, tilt information in the scan direction before the exposure slit in the scan exposure moves to the exposure area 500. FIGS. 3 and 4 are schematic views of the measurement points K1 to K5 for the exposure area 500, in which FIG. 3 shows three measurement points K1 to K3 while FIG. 4 shows five measurement points K1 to K5.

FIG. 4 arranges five measurement points K1 to K5 to be projected in the front area 510 for the exposure area 500 so as to precisely obtain focus and tilt information just before the exposure to the exposure area 500, and drive and correct an exposure position. Similarly, five measurement points K1 to K5 are to be projected in the back area 520 for the scan exposure in the reverse direction.

Figure 5:
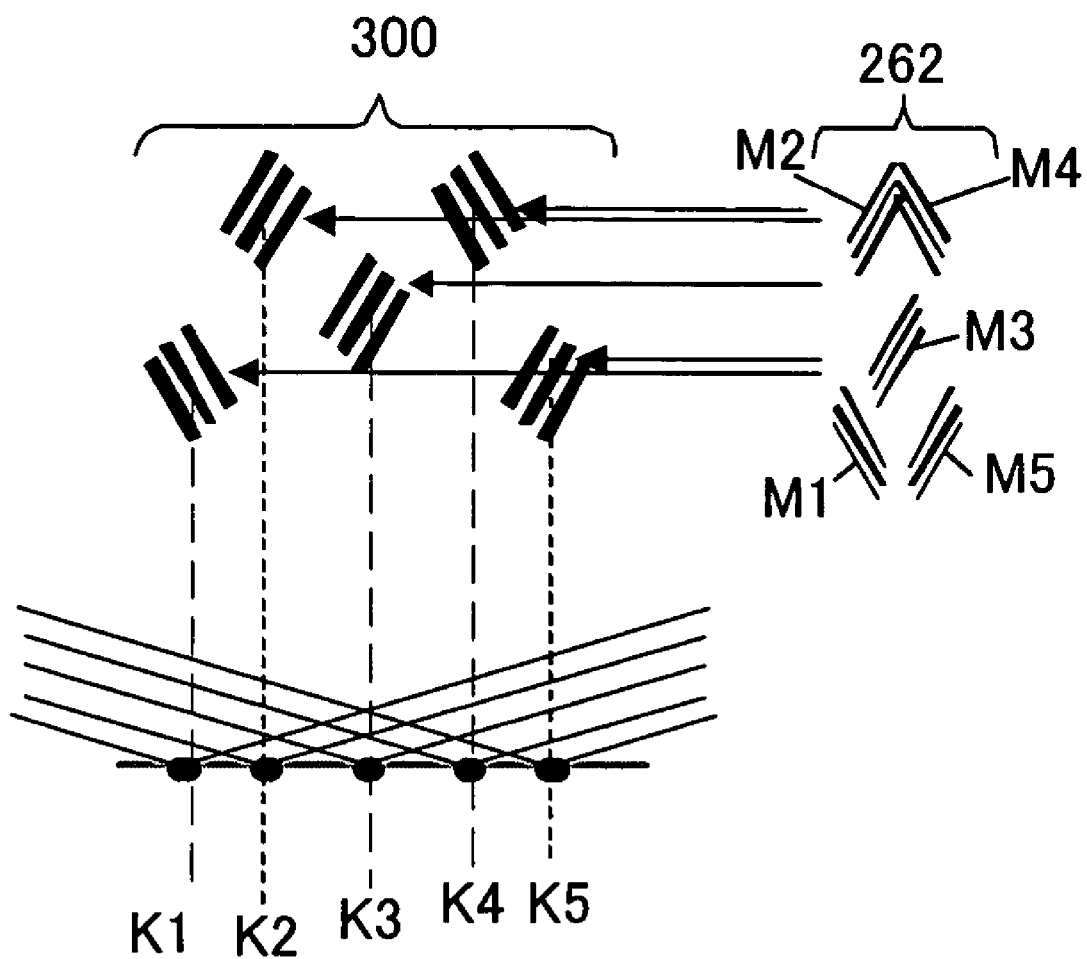
FIG. 5 is a schematic optical diagram showing a measurement system of the focus and tilt in an exposure station shown in FIG. 1.

FIG. 5 shows an enlarged view of an area A in FIG. 1. Here, FIG. 5 is a schematic optical view showing a focus/tilt measurement system in the exposure station 200, although FIG. 5 shows only five measurement points K1 to K5 in the focus and tilt measurement area (for instance, the front area 510) for illustrative convenience. In particular, the instant embodiment illustrates an arrangement of marks M2 to M5 wherein an interval between the measurement points K2 and K4 is different from that among the measurement points K1, K3 and K5. Plural optical axes for the focus and tilt measurement are aligned with a direction orthogonal to the scan direction. These marks M1 to M5 to be projected at the measurement points K1 to K5 are rotated by a certain amount in a section perpendicular to the optical axis of the focus and tilt measurement optical system and then projected. As a result, the measurement slit faces obliquely on the wafer 300 and the slit pitch direction directs to the central measurement position.

Figure 6:
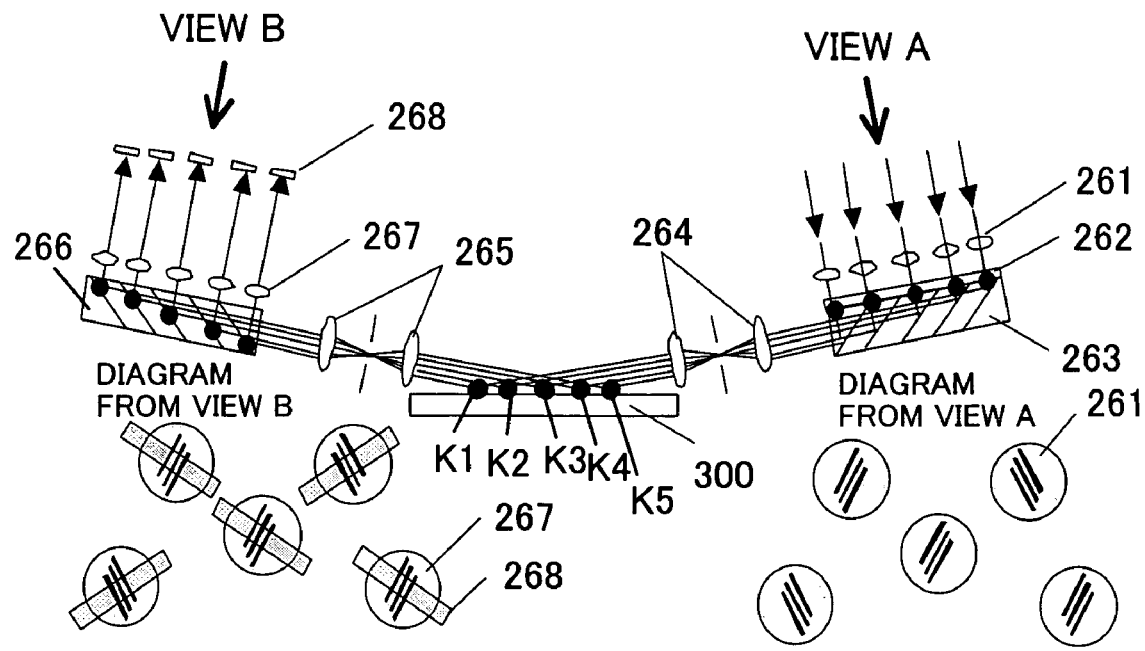
FIG. 6 is a schematic arrangement view of a measurement optical system so as to implement an arrangement of the measurement points shown in FIG. 5.

FIG. 6 is a schematic arrangement view of the measurement optical system for realizing an arrangement of the measurement points shown in FIG. 5. Five illumination lenses 261 allows the light supplied from the light source (not shown) to illuminate slit marks for the focus measurement formed on the projection pattern mask 262 for the focus and tilt measurements. The light source preferably employs a halogen lamp or LED with such a relatively wide wavelength that the light does not expose the photoresist on the wafer 300 or is not affected by interference in the resist thin film. The mask 262 forms slit marks for plural measurement points as shown in a diagram viewed from a direction A. An optical-path synthesizer prism 263 synthesizes optical paths of beams formed from illuminated plural measurement marks, and a focus mark projection optical system 264 projects the light onto the wafer 300 obliquely.

The light reflected on the wafer 300 surface forms an intermediate imaging point in an optical-path division prism 266 through the focus light-receiving optical system 265. After the optical-path division prism 266 divides the optical path for each measurement point, an enlargement detection optical system 267 arranged for each measurement point in order to improve measurement resolution introduces the light to a position detection element 268 for each measurement point. Each position detection element 268 uses one-dimensional CCD in this embodiment, and the arrangement direction of the elements is the measurement direction. A diagram viewed from the direction B shows a relationship among the measurement marks, the position detection element 268, and the enlargement detection optical system 267. The position detection element 268 for each measurement point is provided in a direction orthogonal to the slit mark.

The position detection element 268 uses a one-dimensional CCD, but may arrange a two-dimensional CCD. Alternatively, it may be adapted to form a reference slit plate on a light-receiving element's imaging surface, scan light in front of the reference slit plate, and detect a transmission light volume through the reference slit plate.

Figure 7:
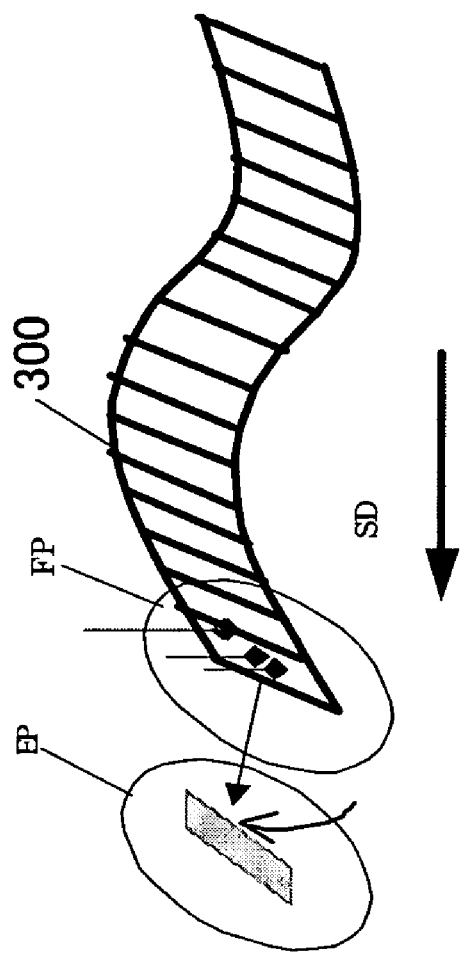
FIG. 7 is a schematic perspective view showing an exposure position and focus/tilt measurement positions on a wafer.
Figure 8:
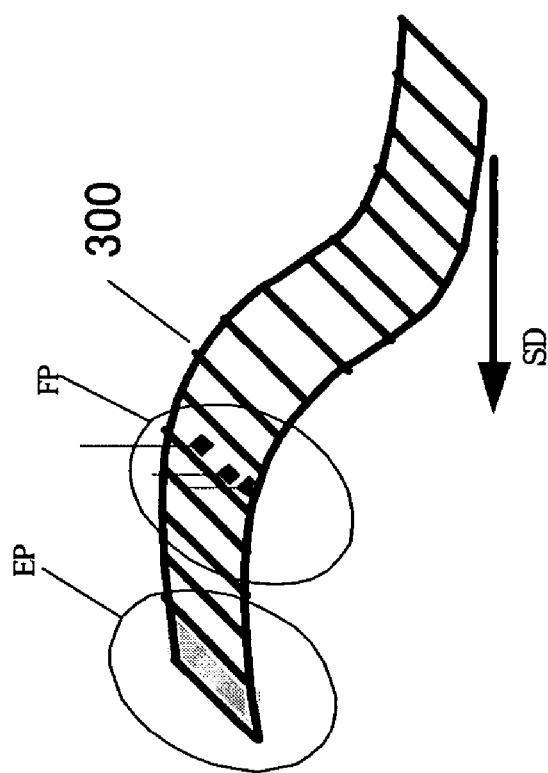
FIG. 8 is a schematic perspective view showing that a wafer is driven to an exposure position based on the position information of each shot on the wafer obtained from a detecting system.

A description will be given of an overview of a surface position correction in the focus and tilt measurement at the scan exposure. Before the exposure position EP moves to the wafer 300 with a rough shape in a scan direction SD, the focus of the surface position of the wafer 300, the tilt in the longitudinal direction in the exposure slit (or a direction perpendicular to the scan direction SD) (which tilt is referred to as "tilt X") as well as the tilt in the width direction in the exposure slit (which tilt is referred to as "tilt Y") are conducted, as shown in FIG. 7, plural focus and tilt positions FP arranged so as to form a plane in front of the exposure slit. Based on the positional information obtained by the detecting system 260, corrective driving is conducted, as shown in FIG. 8, to drive the wafer stage 250 to the exposure position EP. In FIG. 8, the correction has been completed so as to expose the exposure slit when the exposure slit moves to the area that has been measured before the exposure. Here, FIG. 7 is a schematic perspective view showing the exposure position EP, focus and tilt measurement positions FP on the wafer 300. FIG. 8 is a schematic perspective view showing that the wafer 300 is driven to the exposure position EP based on the positional information of each shot on the wafer 300 obtained from the detecting system 260.

The controller 270 can communicate with the measuring station 100, and controls the detection by the detecting system 260 according to the flatness of each shot (i.e., a specific shot and a non-specific shot) on the wafer 300 obtained by the measuring station 100. More specifically, the controller 270 executes the five-point measurement to the specific shot as shown in FIG. 4, and the three-point measurement to the non-specific shot as shown in FIG. 3. In other words, the controller 270 controls the detecting system 260 so as to obtain more detailed flatness information from the specific shot than that from the non-specific shot.

The flatness of the wafer 300 is affected by a structural error of the stage that supports the wafer 300. Therefore, the measuring station 100 and the exposure station 200 use the same wafer stage for the wafer stages 150 and 250 for supporting the wafer 300, for the reduced error and precise focus detections and driving.

Figure 9:
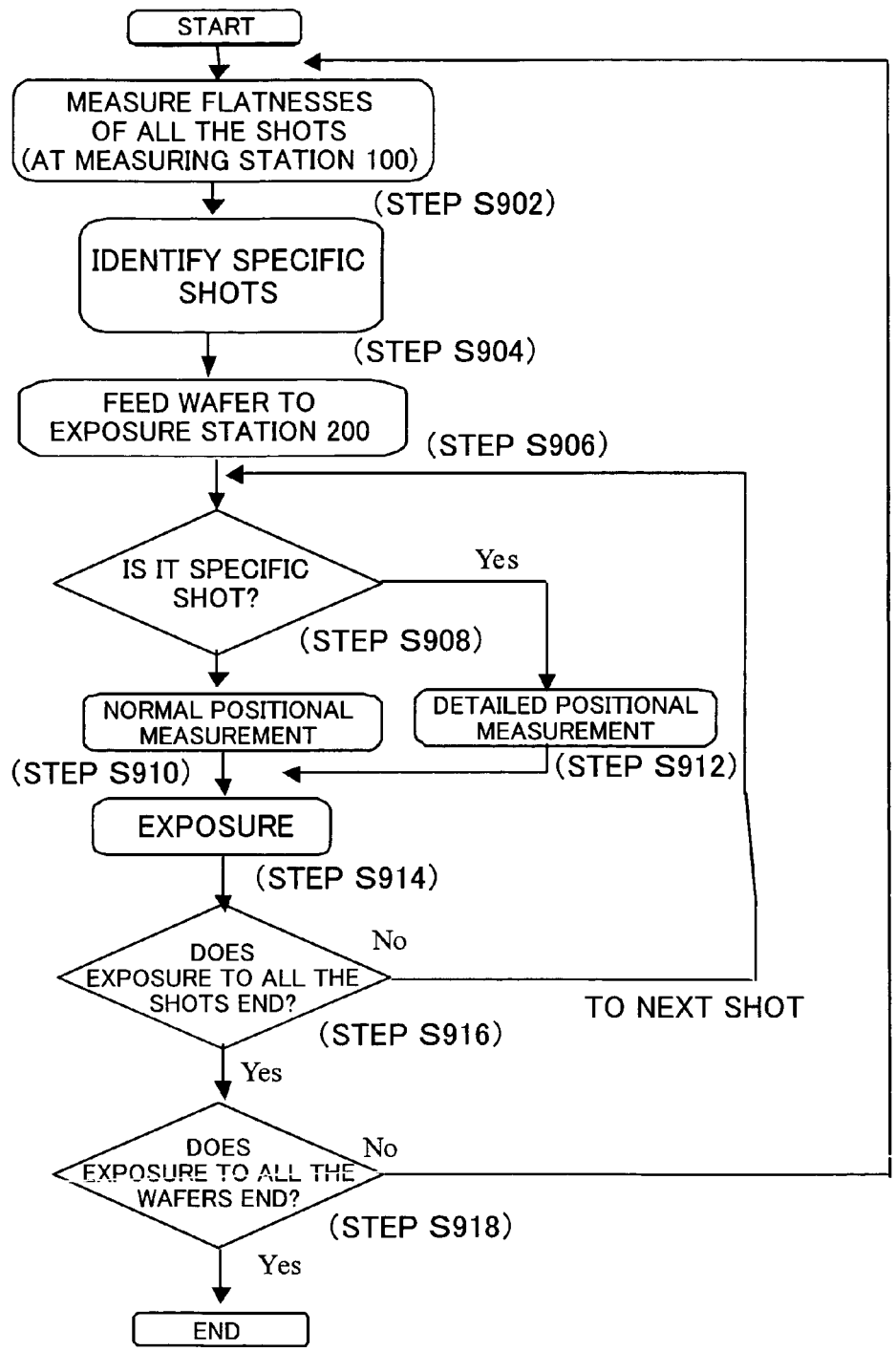
FIG. 9 is a flowchart for explaining an exposure method as one embodiment according to the present invention.

Referring now to FIG. 9, a description will be given of an exposure method using the above exposure apparatus 1. FIG. 9 is a flowchart for explaining an exposure method 100 according to one embodiment of the present invention. Referring to FIG. 9, the measuring station 100 measures the flatnesses of all the shots on the wafer 300 (step S902).

Next, among all the shots on the wafer 300, a shot whose flatness measured by the step S902 is outside the predetermined range (or a shot having a bad flatness) is identified as a specific shot (step S904). One identifying method of identifying the specific shot averages the flatness information of all the shots on the wafer 300, calculates the average flatness among these shots, and identifies a shot as a specific shot whose flatness is outside a range that centers on the average flatness with a predetermined threshold, such as 100 nm. Another identifying method measures the flatnesses of plural shots on plural wafers in the same process in advance, calculates an average value of the flatnesses, and determines whether it is a specific shot based on a difference between the average value and the flatness of each shot.

After the measuring station 200 measures the flatness of each shot on the wafer 300, the wafer 300 is fed to the exposure station 200 (step S906). Whether a shot on the wafer 300 to be exposed is a specific shot is determined (step S908). If it is a non-specific shot, the normal positional measurement is conducted, for example, the focus and tilt are measured at a pitch of 3 mm (step S910). If it is a specific shot, the detailed positional measurement is conducted, for example, the focus and tilt are measured at a pitch of 1 mm (step S912).

Next, the exposure follows (step S914) while the focus and tilt driving are performed for the non-specific shot or the specific shot based on the measurement result of the steps S910 and S912. Then, whether all the shots are exposed on the wafer 300 is determined (step S916). When all the shots have been exposed, the procedure moves to the step S918. When all the shots have not yet been exposed, the step S908 and subsequent steps are repeated so as to expose the next shot. In the step S918, whether all the wafers 300 have been exposed is determined (step S918). When all the wafers 300 have not yet been exposed, the step S902 and subsequent steps are repeated so as to expose the next wafer. When all the wafers 300 have been exposed, the procedure ends.

The exposure method of the instant embodiment uses a short measuring timing only for the specific shot having the bad flatness, and corrects the focus of the specific shot having the bad flatness while minimizing the decreases of the scan speed during the exposure time and the throughput caused by the long measuring time period.

While the instant embodiment classifies the shots on the wafer 300 into a specific shot having the bad flatness and a non-specific shot, the specific shot can be further classified into two types, e.g., one type of shot providing a non-defective device, and the other type of shot providing a defective device. No positional measurement and exposure are performed for a shot that is identified as the defective shot.

An identifying method of a specific shot may use for comparison purposes the flatness of a shot after its focus and tilt are measured at a pitch of 3 mm. A sampling value optimal to the exposure, such as a pitch of 0.5 mm, may be calculated based on the measurement of the flatness to identify the specific shot.

Figure 10:
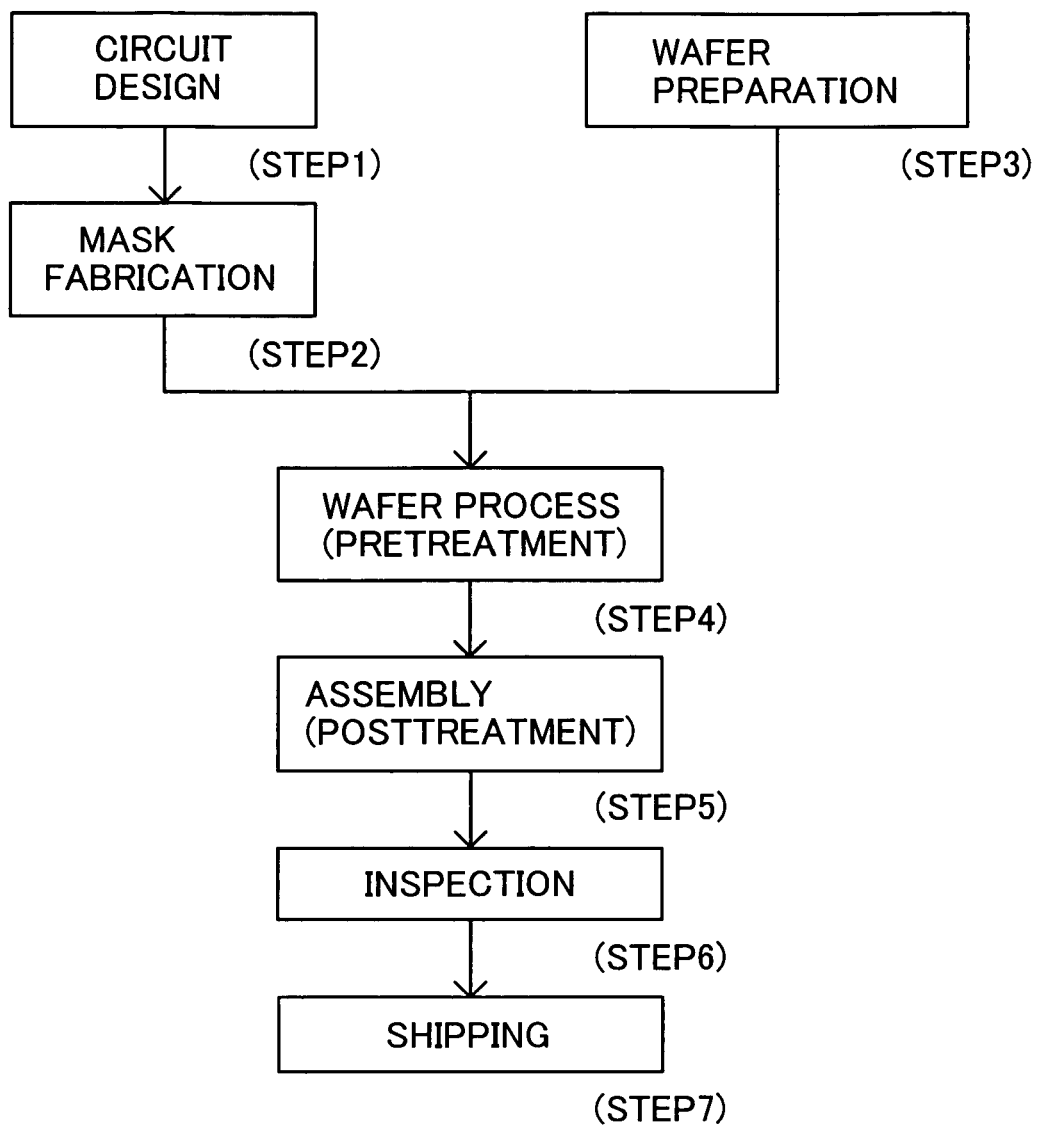
FIG. 10 is a flowchart for explaining a method for fabricating devices (semiconductor chips such as ICs, LSIs, and the like, LCDs, CCDs, etc.).
Figure 11:
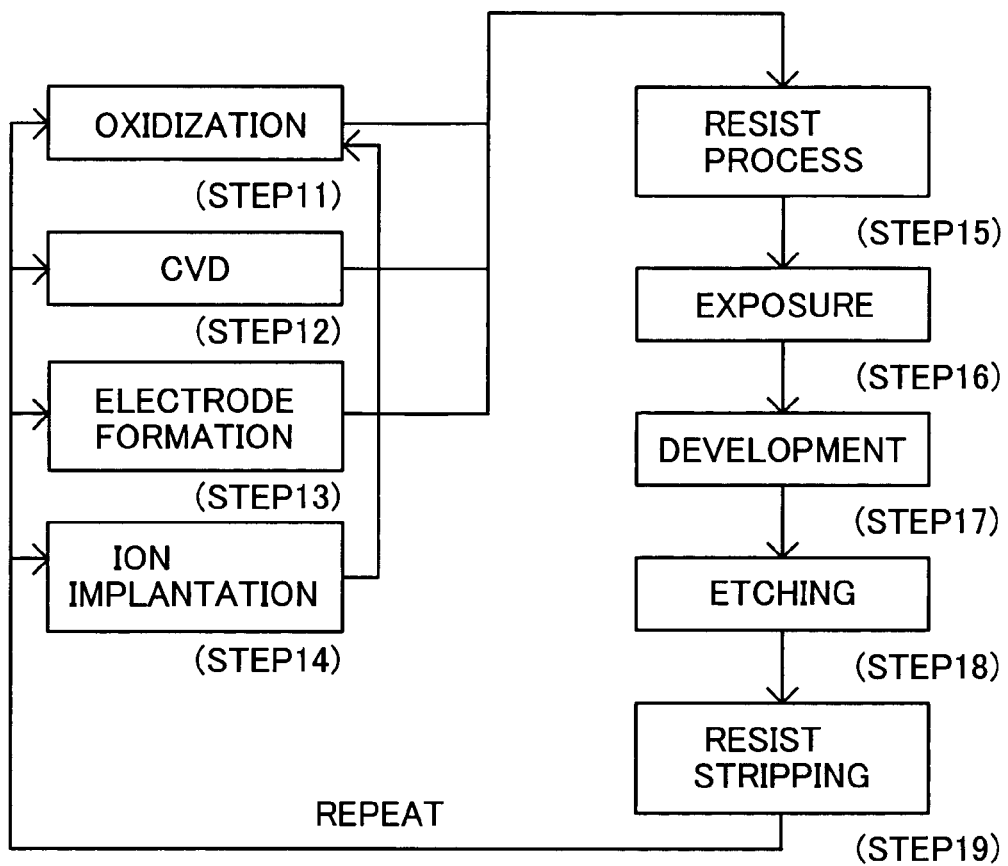
FIG. 11 is a detailed flowchart for Step 4 shown in FIG. 10.
Figure 12:
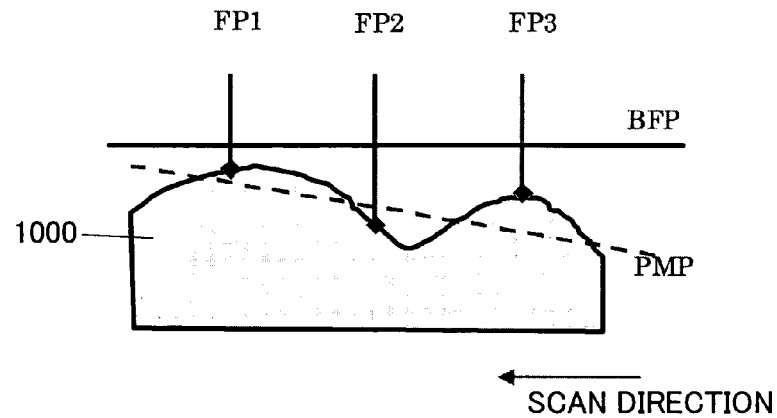
FIG. 12 is a schematic sectional view showing focus/tilt measurement positions on a wafer.
Figure 13:
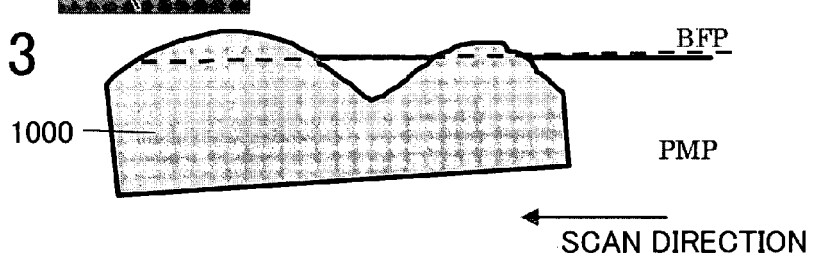
FIG. 13 is a schematic sectional view showing the wafer that has been driven to an optimal image-surface position based on the measurement result.
Figure 14:
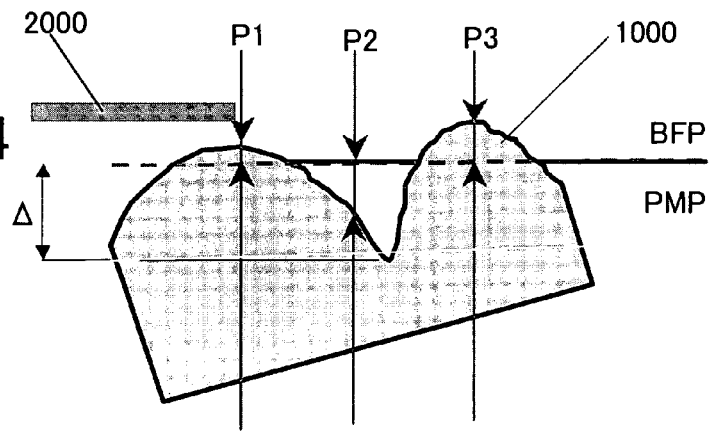
FIG. 14 is a schematic sectional view showing an offset between a pre-scan plane and the wafer.

Referring now to FIGS. 10 and 11, a description will be given of an embodiment of a device manufacturing method using the above exposure apparatus 1. FIG. 10 is a flowchart for explaining the way of manufacturing devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4 in FIG. 16. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever. Thus, the device fabrication method using the exposure apparatus 1 and the resultant device constitute one aspect of the present invention.

Further, the present invention is not limited to these preferred embodiments and various variations and modifications may be made without departing from the scope of the present invention. For example, while the instant embodiment provides a measuring station and an exposure station, the Mirau interferometer may be formed as an exposure station. When during the exposure of one shot, the flatness of the next shot to be exposed is measured, the throughput does not reduce remarkably. In this case, two Mirau interferometers are provided in the exposure station so as to measure the next shot whichever direction the prior shot is exposed in.

The present invention can thus provide an exposure method and apparatus for successfully correcting the focusing to the wafer surface's flatness without lowering the throughput.

This application claims foreign priority benefits based on Japanese Patent Application No. 2003-415891, filed on Dec. 15, 2003, which is hereby incorporated by reference herein in its entirety as if fully set forth herein.

What is claimed is:

1. An exposure method for exposing each of a plurality of shots on an object to light via a pattern of a reticle while the reticle and the object are scanned, said method comprising steps of:

measuring flatness of each of the plurality of shots on the object;

specifying a shot, among the plurality of shots, whose flatness is worse than a predetermined threshold as a specific shot based on the measured flatness;

measuring height of a measurement point in each of the plurality of shots on the object, while the reticle and the object are scanned, a pitch of the measurement points in the specific shot being smaller than a pitch of the measurement points in a shot other than the specific shot;

controlling at least one of a height and a tilt of the object, while the reticle and the object are scanned, based on the measured height; and exposing each of the plurality of shots to light via the pattern of the reticle in parallel with said height measuring step and said controlling step.

2. A method according to claim 1, wherein said specifying step a determines the threshold by averaging the measured flatness of the plurality of shots.

3. A method according to claim 1, wherein said specifying step further specifies a defective shot based on the measured flatness.

4. An exposure apparatus for performing an exposure of each of a plurality of shots on an object to light via a pattern of a reticle while the reticle and the object are scanned, said apparatus comprising:

a first detector configured to detect flatness of each of the plurality of shots on the object;

a reticle stage configured to hold the reticle and to move;

an object stage configured to hold the object and to move;

a second detector configured to detect height of a detection point in each of the plurality of shots on the object, while the reticle and the object are scanned; and a controller configured to specify a shot, among the plurality of shots, whose flatness is worse than a predetermined threshold as a specific shot based on the detected flatness, to cause said second detector to detect the height, while the exposure is executed, such that a pitch of the detection points in the specific shot is smaller than a pitch of the detection points in a shot other than the specific shot, and to control at least one of a height and a tilt of said object stage, while the exposure is executed, based on the detected height.

5. A method of manufacturing a device, said method comprising the steps of:

exposing an object to light via a pattern of a reticle while the reticle and the object are scanned, using an exposure apparatus as defined in claim 4;

developing the exposed object; and processing the developed object to manufacture the device.

6. An apparatus according to claim 4, wherein said controller is further configured to determine the threshold by averaging the measured flatness of the plurality of shots.

7. An apparatus according to claim 4, wherein said controller is further configured to specify a defective shot based on the measured flatness.

8. An exposure method for exposing each of plurality of shots on an object to light via a pattern of a reticle while the reticle and the object are scanned, said method comprising steps of:

measuring flatness of each of the plurality of shots on the object;

measuring height of a measurement point in each of the plurality of shots on the object, while the reticle and the object are scanned, with a pitch of the measurement points according to the measured flatness;

controlling at least one of a height and a tilt of the object, while the reticle and the object are scanned, based on the measured height; and exposing each of the plurality of shots to light via the pattern of the reticle in parallel with said height measuring step and said controlling step.

9. An exposure apparatus for performing an exposure of each of a plurality of shots on an object to light via a pattern of a reticle while the reticle and the object are scanned, said apparatus comprising:

a first detector configured to detect flatness of each of the plurality of shots on the object;

a reticle stage configured to hold the reticle and to move;

an object stage configured to hold the object and to move;

a second detector configured to detect height of a detection point in each of the plurality of shots on the object, while the reticle and the object are scanned; and a controller configured to cause said second detector to detect the height, while the exposure is executed, with a pitch of the detection points according the detected flatness, and to control at least one of a height and a tilt of said object stage, while the exposure is executed, based on the detected height.

* * * * *